(12) United States Patent
Pellanda et al.

(10) Patent No.: US 10,262,906 B2
(45) Date of Patent: Apr. 16, 2019

(54) METHOD OF PRODUCING A FUNCTIONAL INLAY AND INLAY PRODUCED BY THE METHOD

(71) Applicant: ASSA ABLOY AB, Stockholm (SE)

(72) Inventors: Laurent Pellanda, Colombier (CH); Julien Richard, Bulle (CH)

(73) Assignee: ASSA ABLOY AB, Stockholm (SE)

( * ) Notice: Subject to any disclaimer, the term of this patent is extended or adjusted under 35 U.S.C. 154(b) by 0 days.

(21) Appl. No.: 15/533,681

(22) PCT Filed: Dec. 15, 2014

(86) PCT No.: PCT/IB2014/066913
§ 371 (c)(1),
(2) Date: Jun. 7, 2017

(87) PCT Pub. No.: WO2016/097817
PCT Pub. Date: Jun. 23, 2016

(65) Prior Publication Data
US 2017/0365530 A1    Dec. 21, 2017

(51) Int. Cl.
*H01L 21/66* (2006.01)
*H01L 23/00* (2006.01)
*G06K 19/077* (2006.01)

(52) U.S. Cl.
CPC ........ *H01L 22/12* (2013.01); *G06K 19/07754* (2013.01); *H01L 24/85* (2013.01); *H01L 2224/04042* (2013.01)

(58) Field of Classification Search
None
See application file for complete search history.

(56) References Cited

U.S. PATENT DOCUMENTS

| 5,572,410 A | 11/1996 | Gustafson |
| 6,233,818 B1 | 5/2001 | Finn et al. |
| (Continued) | | |

FOREIGN PATENT DOCUMENTS

| EP | 2001077 | 12/2008 |
| WO | WO 2008/114091 | 9/2008 |
| WO | WO 2014/008937 | 1/2014 |

OTHER PUBLICATIONS

International Search Report and Written Opinion for International (PCT) Patent Application No. PCT/IB2014/066913, dated Nov. 5, 2015 9 pages.

(Continued)

*Primary Examiner* — Mounir S Amer
(74) *Attorney, Agent, or Firm* — Schwegman Lundberg & Woessner, P.A.

(57) ABSTRACT

The method of manufacturing a functional inlay, comprises at least the steps of: (1) providing a substrate with a wire antenna embedded therein and with an aperture wherein two wire antenna portions are positioned over said aperture; (2) acquiring the positions and the dimensions of said wire antenna portions and of said aperture; (3) determining if the acquired positions and dimensions meet predetermined tolerances; (4) if the acquired dimensions and positions meet said tolerances, then placing a chip in fie aperture so that said wire portions are positioned over connections pads of said chip and then bonding said wire portions to said connection pads.

20 Claims, 4 Drawing Sheets

(56) References Cited

U.S. PATENT DOCUMENTS

| | | | |
|---|---|---|---|
| 6,259,038 B1* | 7/2001 | Sakaguchi | H01L 22/34 |
| | | | 174/261 |
| 2008/0155822 A1 | 7/2008 | Finn | |
| 2009/0213027 A1* | 8/2009 | Finn | G06K 19/07327 |
| | | | 343/866 |

OTHER PUBLICATIONS

International Preliminary Report on Patentability for International (PCT) Patent Application No. PCT/IB2014/066913, dated Jun. 20, 2017 7 pages.

* cited by examiner

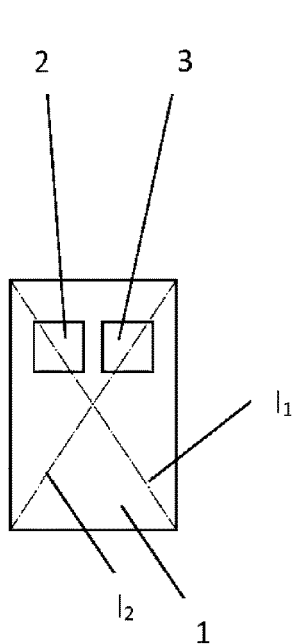
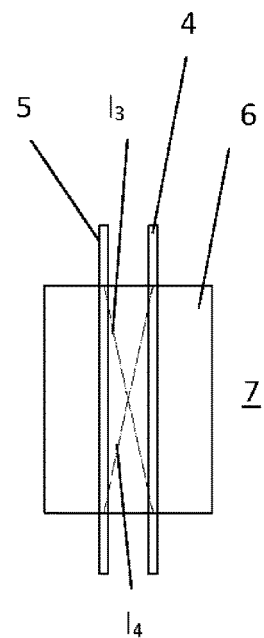
Figure 2
Figure 3
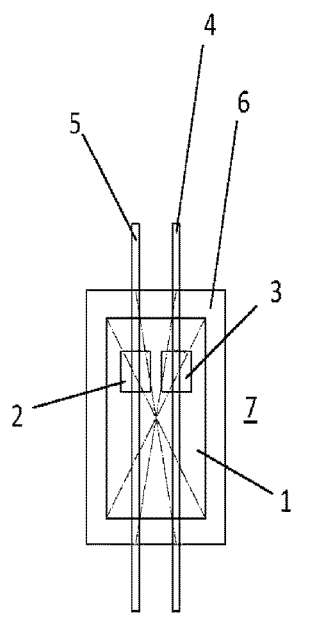
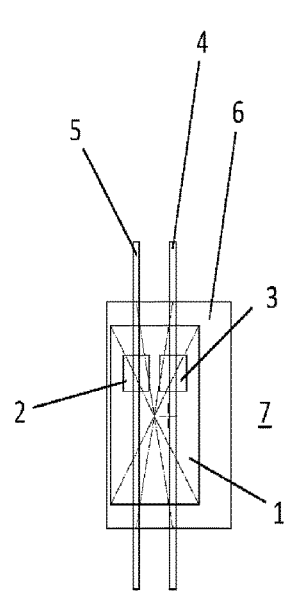
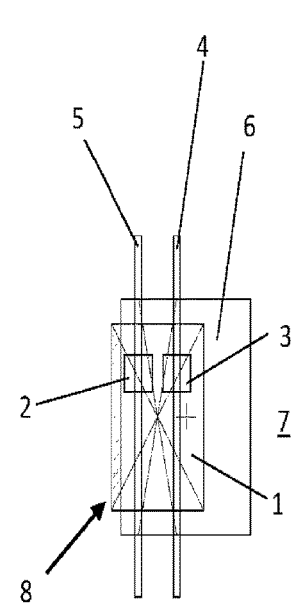
Figure 4A
Figure 4B
Figure 4C

METHOD OF PRODUCING A FUNCTIONAL INLAY AND INLAY PRODUCED BY THE METHOD

CROSS REFERENCE TO RELATED APPLICATION

This application is a national stage application under 35 U.S.C. 371 of PCT Application No. PCT/IB2014/066913, having an international filing date of Dec. 15, 2014, which designated the United States, which is incorporated herein by reference in its entirety.

TECHNICAL FIELD

The present invention concerns the field of RFID devices composing an antenna connected to a chip via direct bonding.

More specifically, the present invention concerns a method for direct bonding of a chip to a wire antenna which is embedded in a substrate to form a functional inlay.

The present invention also concerns a functional inlay produced by the method described herein.

BACKGROUND ART

U.S. Pat. No. 6,233,818 to Finn et al. discloses a method of manufacturing an RFID inlay. More specifically, this patent discloses a process and device for the contacting of a wire conductor in the course of the manufacture of a transponder unit arranged on a substrate and comprising a wire coil and a chip unit such as a chip module with terminal areas. By virtue of the process according to the invention described in this prior art, there is no longer any necessity, with a view to bringing the terminal areas of the chip unit into contact with the ends of the coil to provide a separate contact substrate on which enlarged terminal areas are formed. Rather, the coil substrate, which is used as substrate for the wire coil and which, for example in the case where the transponder unit is intended to serve for the manufacture of a chip card, is formed by means of a plastic support sheet corresponding to the dimensions of the chip card, serves as a contacting or positioning aid for the relative positioning of the ends of the coil in relation to the terminal areas of the chip unit. In this case the chip unit may either be arranged in a recess in the substrate provided for this purpose or may be provided on the surface of the substrate. The first alternative affords the possibility of arranging the chip unit in the recess optionally prior to fixation of the wire conductors or of introducing the chip unit into the recess only after fixation of the wire conductors, in order subsequently to implement the actual contacting of the wire conductors on the terminal areas.

More specifically, in this prior art, firstly an antenna is applied to the substrate via a wiring device using ultrasound to attach the wire to the substrate. An antenna is thereby formed with an initial antenna region and a final antenna region, both regions traversing a window shaped-substrate recess. Then, a chip module is placed in the recess whereby terminal contact areas of the module abut the initial and terminal antenna regions. Subsequently, an electrical connection is realized between the terminal contact areas and the initial and final antenna regions of the antenna by means of a thermode which, under the influence of pressure and temperature, creates a connection by material closure between the wire antenna and the terminal contact areas of the chip (this is also called thermo compression).

EP patent application 2 001 077 discloses a method for producing a device comprising a transponder antenna connected to contact pads and a device obtained by said process. Specifically, an antenna with terminal connections is provided in contact with a substrate. Contact pads are placed on the substrate and connected to the terminal sections of the antenna. The connection is produced by means of a soldering step by introducing energy between the pads and the terminal sections. The pads are placed such as to provide a surface facing an antenna terminal connection section. The section is arranged on the substrate and the soldering energy is directly applied to the pads. A cavity is produced in the substrate close to the antenna terminal sections and a microcircuit is inserted at least partly in the cavity with contact pads positioned facing the antenna terminal sections. Finally a soldering step is carried out using thermo-compression or ultrasound. To carry out this soldering step, an anvil is used that goes through a reinforcing sheet or layer opposite the terminal section to provide a support during the soldering operation. This process therefore imposes the creation of a hole for the anvil which has to be carefully placed to correspond to the position of the terminal section.

The inventions disclosed in the publication cited above all use chip modules. By definition, a chip module is much larger than a chip per se and the module also comprises much larger connection pads. A typical chip module for contactless inlay is the mob6 from NXP, presenting a surface area of 8100×5100 µm for a thickness of 300 µm, with connection pads having a surface area of 1500×5100 µm each.

U.S. Pat. No. 5,572,410 discloses a chip being directly connected to wire antenna. In this patent, a wire is wound around a core and the two ends of the wire are soldered to metal paths deposited over the active layer of the chip. This technology, which is called "direct bonding", minimizes the size of the resulting transponder and the number of its constituting elements, and as a consequence the related production costs.

The metal paths which are extensions of the usual small pads of the chips, are called megabumps (or megapads) and have a dimension adapted to the connection of the antenna wire (which has typically a diameter of 60-80 µm). For example, a typical chip used for such applications is the Hitag µ from NXP, wherein the chip surface area is of 550×550 µm for 150 µm thickness and the megabump show a surface area of 294×164 µm (while the original pads are only 60×60 µm).

It also has to be noted that in the particular application disclosed in this patent, the antenna is not embedded in a support layer but wound around a ferrite core. The resulting transponder has a resonant frequency of about 125 kHz and the antenna show over 300 turns. This does not require a fine tuning of the antenna, and its spires are just wound one onto the other at high speed.

However, if one wants to work at a higher frequency, for example 13.56 MHz, one will have to control the shape and the relative spacing of each spire in order to correctly tune the antenna. Wire embedding is the most efficient and popular technology for manufacturing of high frequency wire antennas, but up to now, this was made exclusively by using chip modules. This introduces an important limitation as the resulting inlay cannot be thinner than the used module.

The manufacturing of thinner high frequency inlays is the main motivation to try to combine direct bonding and wire embedding technologies.

Table 1 proposes a list of some of the high frequency chips on the market which could be used for direct bonding. These chips present much smaller dimensions (not only in thickness) in comparison to the mob6 from NXP described above.

TABLE 1 examples of high frequency chips applicable for direct bonding

| Supplier | Ref. | Chip dims [μm] | Chip thickness [μm] | Bumps dims [μm] | Bump thickness [μm] | Total thickness [μm] |
| --- | --- | --- | --- | --- | --- | --- |
| EM | EM4233 | 1034 × 1054 | 100, 200 or 280 | 300 × 400 | 18 | N/A |
| NXP | MF CLASSIC 1k | 650 × 675 | 150 | 164 × 294 | 18 | 168 |
| INSIDE | Picopass 2k V1.2 | 1198 × 1192 | 280 | 310 × 712 | 20 | 300 |
| NXP | P60D080/P60D144 VA | 2166 × 3004 | 75 | 600 × 600 | 12 | 87 |
| INSIDE | AT90SC28880RCFV | 2740 × 2970 | 75 | 600 × 680 | 12 | 87 |

The problem one is confronted with is to be able to handle such small chips properly while in the same time the antenna wire is fixed on a large sheet of plastic. Solutions used today for chip modules (which are much heavier and larger than single chips) are not usable anymore at such large manufacturing scale.

A solution to this problem has been disclosed in PCT application No. PCT/EP2012/063671 filed on Jul. 12, 2012 in the name of ASSA ABLOY AB, now published under the number WO 2014/008937 A1 the content of this earlier application being entirely incorporated by reference in the present application.

In this prior application, an aim was to manufacture the thinner RFID inlay possible by direct bonding of a chip, such as a RFID chip, to a wire antenna that was embedded in a substrate.

This allowed forming a high frequency RFID monolayer that is thinner than the sum of the thickness of the chip plus the thickness of the antenna (chip and antenna being inside the carrier monolayer itself).

Other HF RFID technologies known in the art and using a naked chip as flip chip technology will be thicker due to the fact that they need a carrier layer without holes where the antenna (etched antenna or screen printed antenna) will be put on. After this step, a chip is connected on the antenna and the final thickness will be the addition of the chip thickness+ antenna thickness+ carrier layer thickness. In this case, a carrier layer has to be added to the total thickness of the layer, a disadvantage that is not present anymore when using the principle of the invention as described in the present application.

According to one aspect, the invention of WO 2014/008937 was directed to a method of direct bonding an embedded wire antenna to a chip whereby the tooling allowed at the same time to hold the chip from one side and to connect the antenna wires to said chip through a connection head, such as a welding head, from the other side.

More precisely, the method described in this prior art reference comprised at least the following steps:
providing a support layer with at least a first and a second side;
embedding at least one wire antenna in the support layer;
processing the support layer with said embedded wire antenna(s) to a connection station in which
the support layer is approached on the first side by a holding device holding at least one chip with a surface comprising connection pads;
the support layer is approached on the second side by a connection device; and
the antenna(s) wire is (are) connected to the connection pads by means of a reciprocal pressure exerted between the holding device and the connection device.

In the prior art method, the support layer with the wire embedded antenna may be processed along a processing path and the holding device and the connection device both may approach the support layer by movements essentially perpendicular to said processing path.

SUMMARY OF THE INVENTION

Using the method known from WO 2014/008937, it has been found that one parameter allowing to achieve a high yield during the industrial implementation of this method is the correct acquisition of the relative position of the different elements to be assembled and the control that they are within predetermined tolerances.

It is therefore an aim of the present invention to provide a method and a system that allows determining with precision the position of the elements to be assembled in order to improve the fabrication process.

According to the invention, the elements to identify and/or to locate are in particular:
the two wire portions of the antenna positioned over the aperture in the substrate in which the antenna is embedded, see FIGS. 2 and 3 and corresponding description of WO 2014/008937;
the edges and dimensions of the aperture, see FIG. 1 and corresponding description of WO 2014/008937;
the exact position of the chip (on the tool), see FIGS. 7 and 8 and corresponding description of WO 2014/008937.

The conditions which have to be met are notably the following:
the inter-axial distance between the two wire portions has to match the inter-axial distance between the connection pads of the chip, if this condition is not met the chip cannot be connected to both wires, at least without the necessity to reposition one wire or both of them;
the distance between the nearest lateral edge of the aperture and one of the wire has to be larger than the distance between the lateral edge of the chip and its nearest connection pad. If this condition is not met, the connected chip will encroach on the substrate as it extends over the limits of the aperture of the substrate.

In principle, the dimensions of the chip including the interspace between the connection pads are known with an extreme precision.

The exact position of the chip on the processing tool (chip holding device) can be acquired mechanically and/or by a vision system, for example a camera or any other equivalent device.

However the positioning tolerance of the chip handling device itself is of about±50 μm.

The wire antenna can be embedded in the substrate with a quite high precision and the estimate variance of the relative position between the two wire portions is of ±30 μm.

According, the most delicate relative positioning operation to achieve in the process is firstly the positioning of the wires with respect to the aperture in the substrate. This is due to the fact that each manufacturing step generates its own tolerance such as:
1) punching or cutting of an aperture in the substrate;
2) wire embedding;
3) stretching of the substrate material during wire embedding i.e. in particular when working on large formats (for ex. 24 apertures and related antennas per sheet).

In the end, the cumulated tolerance of these steps may be of the order of about ±150 μm.

The issue created by these cumulated tolerance depends on condition imposed by the type of inlay which has to be manufactured.

The size of the chip and of its pads vary greatly, as shown in the table available on page 4 of WO 2014/008937 repeated above. However, these parameters are rather stable.

The diameter of the wire for an HF antenna is typically about 80-100 μm. Other diameters are possible, but not really broadly used, (with the exception of UHF wire dipole antennas)

Depending on the substrate material and the desired end product (for example a full polycarbonate (PC) card), one can desire to minimize the space of the aperture which is not occupied by the chip. But the closer both are in dimensions, the more intolerant to positioning errors the process is.

In order to carry out the method and in particular to work on the data acquired (for example optically or by other equivalent means) and calculate the necessary values and determine whether the conditions (such as tolerances) are met, electronic means such as a computer with appropriate programs and resources (network, capacity etc) is used, as a skilled person will understand and envisage.

In one embodiment the present invention concerns a method of manufacturing a functional inlay, comprising at least the steps of:
(1) providing a substrate with a wire antenna embedded therein and with an aperture wherein two wire antenna portions are positioned over said aperture;
(2) acquiring the positions and the dimensions of said wire antenna portions and or said aperture;
(3) determining if the acquired positions and dimensions meet predetermined tolerances;
(4) if the acquired dimensions and positions meet said tolerances, then placing a chip in the aperture so that said wire portions are positioned over connections pads of said chip and then bonding said wire portions to said connection pads.

In an embodiment, the method comprises a step of positioning the two wire antenna portions over the aperture before an acquiring step.

In an embodiment of the method, if the acquired dimensions do not meet the tolerances, then no chip is placed in the aperture and no bonding step is carried out.

In an embodiment of the method, if the acquired positions of the wire antenna portions do not meet the tolerances, then the wire antenna portions are repositioned.

In an embodiment, the repositioning of wire antenna portions is carried out repeatedly until the tolerances are met.

In an embodiment, the method comprises a levelling step of the substrate around the aperture before the acquiring step.

In an embodiment of the method, the positions and the dimensions of the wire and of the aperture are acquired via optical means.

In an embodiment of the method, beside the step of acquiring the positions and the dimensions of the wire antenna portions and of the aperture there is an additional step of acquiring the position and the dimensions of the chip and of the chip connection pads.

In an embodiment, the position and the dimensions of the chip and of the chip connection pads are acquired via optical means.

In an embodiment of the method, the tolerances comprise at least the interaxial distance between two wire antenna portions.

In an embodiment of the method, the tolerances comprise the distance between the nearest lateral edge of the aperture and one of the wire antenna portions which has to be larger than the distance between the lateral edge of the chip and its nearest connection pad.

In an embodiment of the method, the tolerances comprise the distance between the connection pads of the chip.

In an embodiment of the method, the substrate comprises multiple wire antenna portions embedded therein relatively to multiple apertures, and the process steps are repeated for all of them so that at the end a chip is bonded to each antenna for which the tolerances are met.

In an embodiment, the invention concerns a functional inlay obtained by a method as described herein.

BRIEF DESCRIPTION OF THE DRAWINGS

The present invention will be better understood from the following detailed description and from the following drawings.

FIG. 2 illustrates an example of a chip used in the present invention;

FIG. 3 illustrates the wires of the antenna over an opening of the substrate;

FIGS. 4A to 4C illustrate schematically different possible positions of the chip and wires in the opening of the substrate;

DETAILED DESCRIPTION

For the general method of manufacturing an inlay and connecting a chip to the embedded antenna wire to which the present invention may be applied, reference is made to the embodiments of methods and devices disclosed in WO 2014/008937 incorporated by reference therein.

It has also to be noted that all elements (aperture, wires, chip) have a well-defined and quite symmetrical shape (this could be different for example if the pads of the chip are placed in a non-symmetrical manner on the chip). This helps decrease the number of positions and/or dimensions which have to be measured by the system which are at least:
the center of the chip (dimensions and positions of the pads are then deduced very precisely)

the interaxial distance of the two wire portions
the geometrical center of the parallelepiped formed by the two wire portions
the dimensions of the aperture
the geometrical center of the aperture Additionally, to ensure that the camera focus on the right position (depth), an additional tool is used bringing the cavity/wires/sheet (material around the cavity) to a defined height fin the z focus axis of the camera). In the realized embodiment, this tool may simply be a small ring of material which is processed from below the sheet and is then positioned in order to support the layer at the defined height)

The chip holder tool as used in WO 2014/008937 will comprise a similar ring around the chip position, so that when the tool is in the "bonding" position, the cavity/wires/sheet material is positioned exactly at the same position as when measured by the camera. This ensures a perfect matching of the bonding process.

It should also be noted that the tray used to manipulate the sheet with the embedded antennas is formed by a transparent (plastic) plate, showing large apertures around each chip/cavity position (large enough to allow tools to approach from both sides of the sheet). This means that around each cavity, the sheet material is not supported, and shows generally a slight depression (due to its own weight and the antenna wires weight). The process steps described above are mainly here to correct this slight deformation of the sheet.

In a basic embodiment, positions which are determined to be out of the tolerance (wires and/or aperture) are going to be excluded of the bonding step.

Figure 1:
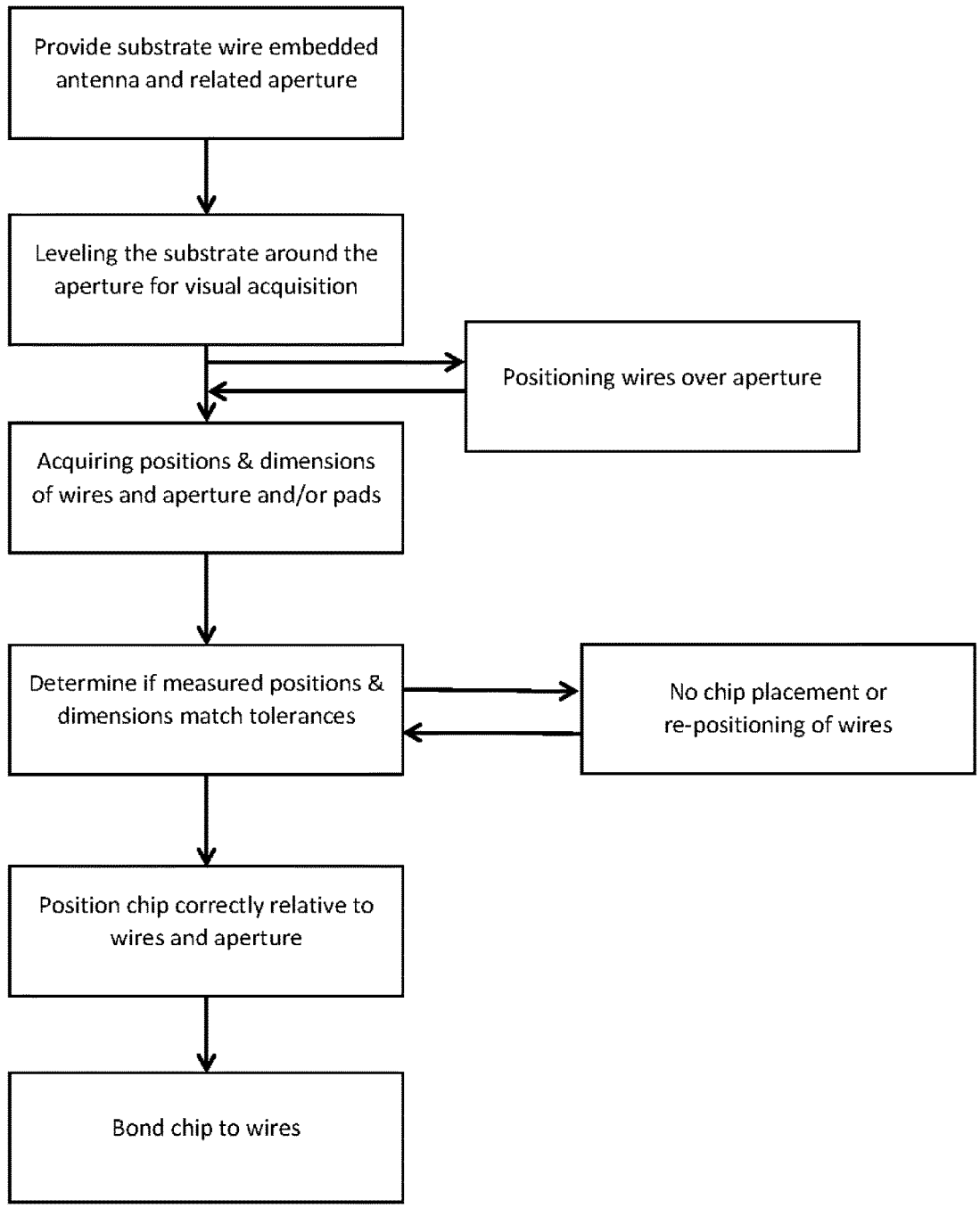
FIG. 1 shows a block diagram of a method according to the present invention.

An embodiment of the method according to the present invention is illustrated in FIG. 1. The method comprises at least the following steps:

(1) providing a substrate with a wire antenna embedded therein and an aperture. Typically, this can be done as illustrated in FIGS. 1 to 3 of WO 2014/008937 and their related description, as a possible realization embodiment;
(2) leveling the substrate around the aperture for visual acquisition, for example via a camera or other equivalent optical means. This step may be realized, as described above, by the use of additional means;
(3) acquiring the positions and the dimensions of the wire and of the aperture. This step may be carried out with adapted optical means, for example a camera or other equivalent means;
(4) acquiring the position and dimensions of the chip. As for the precedent step, this step may be carried out with adapted optical means (for example a camera or other equivalent means);
(5) determining if the measured positions and dimensions match the predetermined tolerances. This step, as described above considers the sizes of the elements measured and their positions to decide whether the tolerances are met and whether the process of the invention may be carried out;
(6) if the measured dimensions and positions match the predetermined tolerances, then the process may be continued and the chip bonded to the wires, as illustrated in FIGS. 7 and 8 of WO 2014/008937 and explained in the corresponding description;
(7) alternatively, if the tolerances (dimensions and positions) are not met, the positions are corrected or the wires are repositioned and a new check is carried out again (step (5) above) and then the process is carried out (step (6) above). If the tolerances are not met once again, then a new correction is carried out with subsequent control. This step may in fact be carried out repeatedly until finally the tolerances are met and the chip is bonded to the wires. Alternatively, it may be carried out a limited number of times (once, twice, etc.) in order not to slow down the overall production process. In another variant, the correction may be carried out only if the tolerance are not met but for a small value, this meaning that a correction step will most probably allow the tolerance to be easily met. If the measured values are too far away from the defined tolerance than no correction step is carried out and the bonding operation is not carried out at all.

FIG. 2 illustrates a top view of a chip 1 with its connection pads 2, 3. This chip typically corresponds to the chip 11 of WO 2014/008937 (see FIGS. 7 and 8 of this earlier application). The center point of this chip is determined by the crossing of the two lines I1, I2.

FIG. 3 illustrates a top view of the ends 4, 5 of a wire antenna passing over the opening 6 of a substrate 7. This typically corresponds to FIG. 3 of WO 2014/008937. The two crossing lines I3, I4 allowing to determine the geometrical center point of the parallelepiped formed by the two wire portions 4, 5.

FIG. 4A illustrates the positioning of a chip 1 with its pads 2, 3 over the antenna ends 4, 5 in the opening 6 of a substrate 7. This corresponds merely to the situation illustrated in FIGS. 7 to 10 of WO 2014/008937. The chip may be easily aligned with the antenna ends if both center points are aligned. The situation illustrated is ideal with an essentially constant distance between the sides of the chip 2 and the sides of the opening 6.

FIG. 4B illustrates another positioning step of a chip 1 with its pads 2, 3 over the wire ends 4, 5 but here the wire ends 4, 5 are not perfectly aligned in the opening (as in FIG. 4A) but are offset to the (left) side. In the case illustrated, one sees that the necessary tolerances are still met and that the chip 1 is still within the opening 6 so that the bonding may be carried out.

FIG. 4C illustrates another positioning step of a chip 1 with its pads 2, 3 over the wire ends 4, 5 but here the wire ends 4, 5 are further offset to the (left) side by comparison with FIG. 4B. In this case, one sees that because of the size of the chip, when the center points are aligned there is an overlap zone 8 between the chip 1 and the substrate 7 that renders the bonding not possible. In this case, we run in the situation of step (7) above, and a correction (here a repositioning of the wire ends 4, 5 with a shift to the right side) is necessary. This shift may be carried out with appropriate means of the machine to reach the positions illustrated in FIG. 4B or even better as illustrated in FIG. 4A.

Figure 4D:
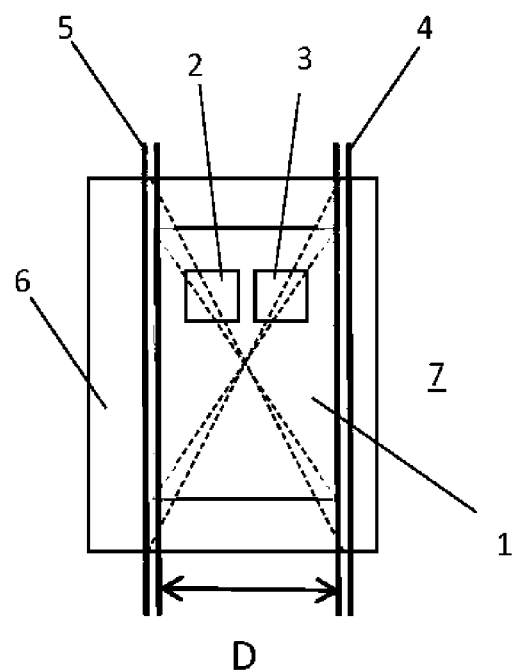
FIGS. 4D and 4E illustrate variants of replacing the wires of the antenna.

FIG. 4D illustrates an embodiment of the process used to displace the wire ends 4, 5 of the antenna if they are not aligned with the pads 2, 3 of the chip 1. It is clear from the figure that the distance D between the wire ends 4 and 5 is much larger than the one between the pads 2 and 3 on the chip 1. This is typically a case wherein if the tolerance values are not met at first, and this can be changed by modifying the positioning of the wire ends.

Figure 4E:
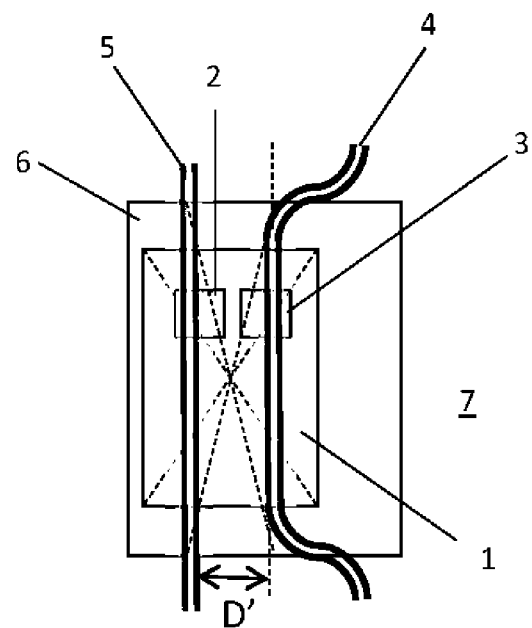

FIG. 4E illustrates a possible embodiment wherein only wire end 4 is moved/formed so that the distance D' between wires ends 4, 5 is in relation to the distance between pads 2, 3 of the chip 1 to allow a proper connection. Appropriate wire-positioning means are disclosed for example in WO2008/114091 which is incorporated by reference in the present application in its entirety. Note however that the preferred embodiment will be to displace/to form the both wires end 4 and 5: either symmetrically or even better by re-centering the wire ends around the center of the cavity (such that the geometrical center of the wire ends meet the geometrical center of the aperture) and with a distance D' corresponding to the distance between the pads 2, 3 of the chip 1.

The choice of the number of wire ends being displaced may be done according to circumstances, for example taking account of the position of the chip 1. For example, as in FIG. 4D, the chip 1 is in the middle of the wire ends 4, 5 with the pads 2, 3 at substantially the same distance from the wire ends 4, 5. In this situation, a symmetric re-placing the wire ends is probably the most effective and quickest way to proceed.

Of course, these are only two illustrations of many different configurations that are possible and the important result sought is that the spacing of the wire ends is corrected to meet the tolerance, that the chip is positioned to align with the wires and that both fit with aperture position/dimensions.

Figure 5A:
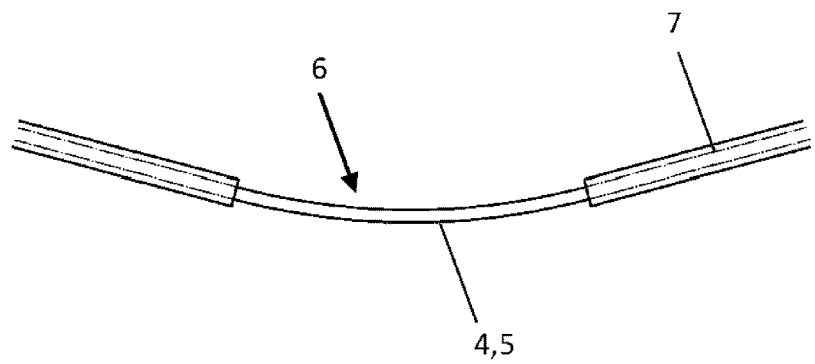
FIGS. 5A to 5C illustrate the means used to support the substrate.
Figures 5B, 5C:
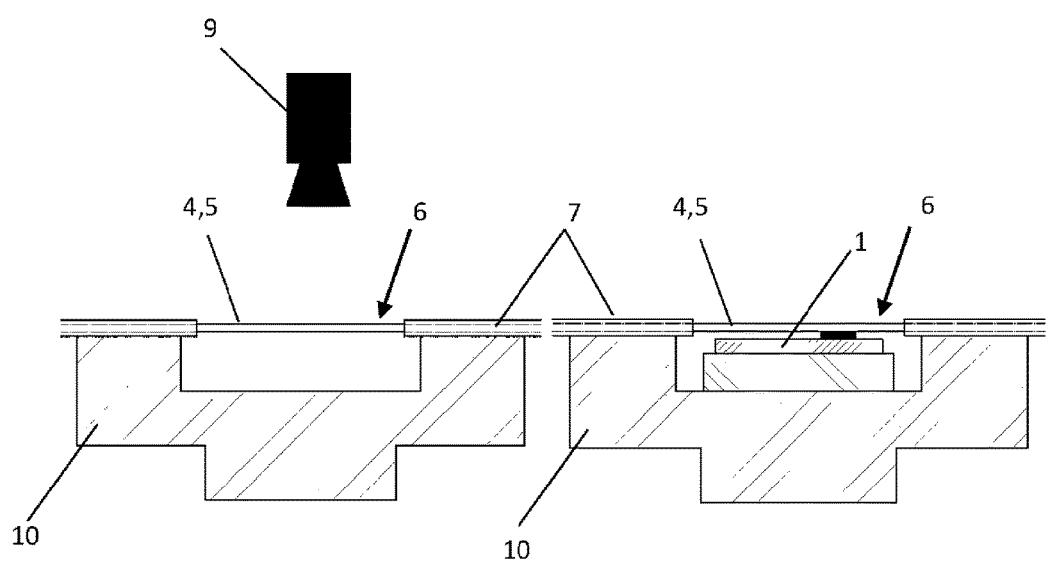

FIG. 5A illustrates the position of the substrate when not supported: as shown, it forms a slight depression. To avoid this depression and present a straight surface to the camera 3 as optical means, a supporting tool 10 is used as illustrated in FIG. 5B. FIG. 5C illustrates the same situation as in FIG. 5B, but with a chip 1 being in position (as for example in the top view of FIG. 4A).

Of course, all the methods and embodiments described herein are to be regarded as illustrative examples and should not be construed in a limiting manner. Modifications are possible within the scope of the present invention, for example by use of equivalent technical means and/or method steps. In addition, different embodiments described herein may be combined together according to circumstances.

What is claimed is:

1. A method of manufacturing a functional inlay, comprising at least the steps of:
   providing a substrate with a wire antenna embedded therein and with an aperture wherein two wire antenna portions are positioned over said aperture;
   acquiring the positions and the dimensions of said wire antenna portions and of said aperture; and
   comparing the acquired positions and dimensions to predetermined tolerances;
   wherein, when the acquired dimensions and positions meet said predetermined tolerances, further placing a chip in the aperture so that said wire portions are positioned over connection pads of said chip and then bonding said wire antenna portions to said connection pads.

2. The method of claim 1, comprising a step of positioning said two wire antenna portions over said aperture before said acquiring step.

3. The method of claim 1, wherein when said acquired dimensions do not meet said predetermined tolerances, then no chip is placed in the aperture and no bonding step is carried out.

4. The method of claim 1 wherein when said acquired positions of said wire antenna portions do not meet said predetermined tolerances, then said wire antenna portions are repositioned.

5. The method of claim 4, wherein said repositioning of said wire antenna portions is carried out repeatedly until said predetermined tolerances are met.

6. The method of claim 1, comprising a levelling step of the substrate around the aperture before said acquiring step.

7. The method of claim 1, wherein the positions and the dimensions of the wire and of the aperture are acquired via optical means.

8. The method of claim 1, further comprising acquiring the position and the dimensions of the chip and of the chip connection pads.

9. The method of claim 8, wherein the position and the dimensions of the chip and of the chip connection pads are acquired via optical means.

10. The method of claim 1, wherein said predetermined tolerances comprise at least an interaxial distance between the two wire antenna portions.

11. The method of claim 1, wherein said predetermined tolerances comprise a distance between a nearest lateral edge of the aperture and one of the wire antenna portions having to be larger than a distance between a lateral edge of the chip and its nearest connection pad.

12. The method as defined in claim 1, wherein said predetermined tolerances comprise a distance between the connection pads of the chip.

13. The method of claim 1, wherein the substrate comprises multiple wire antenna portions embedded therein relative to multiple apertures, and that the process steps are repeated for all of them so that at the end a chip is bonded to each wire antenna portion for which said predetermined tolerances are met.

14. A functional inlay obtained by a method according to claim 1.

15. A method of manufacturing a functional inlay, comprising at least the steps of:
   providing a substrate with a wire antenna embedded therein and with an aperture wherein two wire antenna portions are positioned over said aperture;
   acquiring the positions and the dimensions of said wire antenna portions and of said aperture; and
   comparing the acquired positions and dimensions to predetermined tolerances;
   wherein, when the acquired dimensions and positions meet said predetermined tolerances, then placing a chip in the aperture so that said wire antenna portions are positioned over connection pads of said chip and then bonding said wire antenna portions to said connection pads, and when said acquired dimensions do not meet said predetermined tolerances, then no chip is placed in the aperture and no bonding of said wire antenna portions is carried out.

16. The method of claim 15, wherein if said acquired positions of said wire antenna portions do not meet said predetermined tolerances, then said wire antenna portions are repositioned.

17. The method of claim 15, wherein said predetermined tolerances comprise at least one of the following:
   a. an interaxial distance between the two wire antenna portions;
   b. a distance between a nearest lateral edge of the aperture and one of the wire antenna portions having to be larger than a distance between a lateral edge of the chip and its nearest connection pad; and
   c. a distance between the connection pads of the chip.

18. A method of manufacturing a functional inlay, comprising at least the steps of:
   providing a substrate with a wire antenna embedded therein and with an aperture wherein two wire antenna portions are positioned over said aperture;
   acquiring the positions and the dimensions of said wire antenna portions and of said aperture; and
   comparing the acquired positions and dimensions to predetermined tolerances, wherein said predetermined tolerances comprise a distance between a nearest lateral edge of the aperture and one of the wire antenna portions having to be larger than a distance between a lateral edge of a chip and its nearest connection pad; and wherein, when the acquired dimensions and positions meet said predetermined tolerances, then placing said chip in the aperture so that said wire antenna portions are positioned over connections pads of said chip and then bonding said wire portions to said connection pads.

19. The method of claim 18, comprising a step of positioning said two wire antenna portions over said aperture before said acquiring step.

20. The method of claim 18, wherein the positions and the dimensions of the wire antenna portions and of the aperture are acquired via optical means.

* * * * *